United States Patent
Ahmed et al.

(10) Patent No.: US 10,840,223 B2
(45) Date of Patent: Nov. 17, 2020

(54) AUGMENTED REALITY DISPLAY SYSTEMS WITH SUPER-LAMBERTIAN LED SOURCE

(71) Applicant: INTEL CORPORATION, Santa Clara, CA (US)

(72) Inventors: Khaled Ahmed, Anaheim, CA (US); Kunjal Parikh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 656 days.

(21) Appl. No.: 15/467,974

(22) Filed: Mar. 23, 2017

(65) Prior Publication Data

US 2018/0277523 A1    Sep. 27, 2018

(51) Int. Cl.

| | |
|---|---|
| *G06T 19/00* | (2011.01) |
| *H01L 25/075* | (2006.01) |
| *H01L 33/32* | (2010.01) |
| *H01L 33/24* | (2010.01) |
| *H01L 33/06* | (2010.01) |
| *H01L 27/14* | (2006.01) |
| *H01L 27/15* | (2006.01) |
| *H01L 33/60* | (2010.01) |
| *G09G 5/10* | (2006.01) |
| *G09G 5/377* | (2006.01) |
| *H01L 33/40* | (2010.01) |

(52) U.S. Cl.
CPC ........ *H01L 25/0753* (2013.01); *G06T 19/006* (2013.01); *G09G 5/10* (2013.01); *G09G 5/377* (2013.01); *H01L 27/14* (2013.01); *H01L 27/156* (2013.01); *H01L 33/06* (2013.01); *H01L 33/24* (2013.01); *H01L 33/32* (2013.01); *H01L 33/60* (2013.01); *H01L 33/405* (2013.01); *H01L 2933/0083* (2013.01)

(58) Field of Classification Search
CPC ......... G06T 19/006; G09G 5/10; G09G 5/377
USPC ........................................................ 345/633
See application file for complete search history.

(56) References Cited

U.S. PATENT DOCUMENTS

| | | | |
|---|---|---|---|
| 2011/0157896 A1* | 6/2011 | Yu ............................. | F21V 9/08 |
| | | | 362/293 |
| 2014/0063054 A1* | 3/2014 | Osterhout ............... | G06F 3/005 |
| | | | 345/633 |

OTHER PUBLICATIONS

Arbabi, A. et al., "Efficient dielectric metasurface collimating lenses for mid-infrared quantum cascade lasers", Optics Express, vol. 23, No. 26, Dec. 28, 2015.

(Continued)

*Primary Examiner* — Sean P Gramling
(74) *Attorney, Agent, or Firm* — Green, Howard & Mughal LLP

(57) ABSTRACT

Emissive display devices having LED sources with super-lambertian radiation patterns. An exemplary emission source may have a half-emission-cone-angle of less than 40°. A system, such as an augmented reality display system, employing such an emissive display device may display a reduction in power of up to three times relative to LED sources with a lambertian radiation pattern. In some systems, such as augmented reality display systems, the optical path down stream of such an emissive display device may be simplified and/or dimensionally scaled, and/or manufactured to lower tolerances. For example, a discrete collimating lens may be eliminated from the optical path of such an emissive display device.

19 Claims, 9 Drawing Sheets

(56) References Cited

OTHER PUBLICATIONS

Bergenek, K et al., "Directional light extraction from thin-film resonant cavity light-emitting diodes with a photonic crystal", Applied Physics Letters 93, 231109(2008); doi:10.1063/1.3046130.
Lai, C et al., "Highly-directional emission patterns based on near single guided mode extraction from GaN-based ultra thin microcavity light-emitting diodes with photonic crystals", Applied Physics Letters 97, 013108(2010); doi:10.1063/1.3459970.
Lai, C et al., "Optimized Microcavity and Photonic Crystal Parameters of GaN-Based Ultra thin-Film Light-Emitting Diodes for Highly Directional Beam Profiles", IEEE Photonics Technology Letters, vol. 22, No. 21, Nov. 1, 2010, p. 1547, Digital Object Identifier 10.1109/LPT.2010.2066965.
Lai, C et al., "Structural Effects on Highly Directional Far-Field Emission Patterns of GaN-Based Micro-Cavity Light-Emitting Diodes Wth Photonic Crystals", Journal of Light Wave Technology, vol. 28, No. 19, Oct. 1, 2010, p. 2881.DOI:10.1109/JLT.2010.2061836.
Wiesmann, C et al., "Photonic crystal LEDs—designing light extraction", Laser & Photon.Rev.3, No. 3, 262-286(2009).DOI 10.1002/lpor.200810053.
Wiesmann, C et al., "Theoretical Investigation of the Radiation Pattern From LEDs Incorporating Shallow Photonic Crystals", IEEE Journal of Quantum Electronics, vol. 45, No. 10, Oct. 2009, p. 1273. Digital Object Identifier 10.1109/JQE.2009.2024551.
Texas Instruments, Application Report, Jul. 2010, DLP System Optics, 26 pages.

\* cited by examiner

AUGMENTED REALITY DISPLAY SYSTEMS WITH SUPER-LAMBERTIAN LED SOURCE

BACKGROUND

Augmented reality (AR) device technology, including augmented reality headsets and the like, is currently an area of significant interest. For such platforms, it may be desirable to have a display device that provides red-green-blue (RGB) colors (e.g., full color) in a compact package.

The power efficiency of an AR device may be improved by matching of etendue throughout the system. There are many avenues to arrive at this goal, however. For example, there are a variety of light sources each having an associated etendue. A variety of optical elements may also be employed to convey the light from the source to a display screen or viewport. Such optical elements may be selected to accommodate the etendue of the light source to that of another component. For example, a laser light source with an extremely small etendue may be expanded to better match that of another component. Or, etendue of a light emitting diode (LED) source may be optically reduced to better match that of another component.

Matching etendue in the above examples however is both costly in materials and requires larger platforms. However, if etendue match is sacrificed for the sake of form factor, power efficiency is lost leading to low luminance or high display power consumption. Systems and methods for matching etendue while achieving a small form factor would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
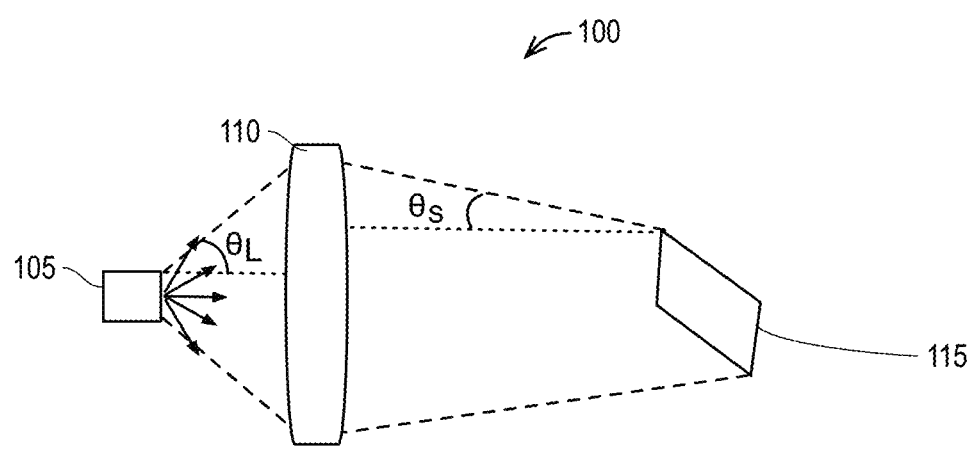
FIG. 1 is a schematic of an AR system, in accordance with some embodiments.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Emissive display devices having LED sources with super-lambertian radiation patterns are described herein. A band of light emitted through an emissive surface of the LED is confined and/or collimated within the LED structure itself, reducing the half-emission-cone angle to an extent that places the radiation pattern between that of a lambertian LED and that of a laser source. An exemplary LED light source may have a half-emission-cone-angle of less than 40°, and advantageously 30°, or less (e.g., 10°-30°). A system, such as an augmented reality display system, employing such an LED source may achieve a reduction in power of up to three times relative to a system employing LED sources having a lambertian radiation pattern. The optical path of such an emissive display device may also be simplified and/or dimensionally scaled, and/or manufactured to lower tolerances as a result of the native collimation. For example, a discrete collimating lens may be excluded from the optical path of an emissive display device.

In some further embodiments described below, a super-lambertian LED structure includes a monolithic metamaterial lens. The metamaterial lens includes a plurality of features having dimensions smaller than the emission wavelength and further reducing the angular emission of light emitted by an LED source. Characteristics (shape, size, placement, pitch, etc.) of the nanoparticles may be selected for the particular wavelength band emitted from the emissive display element.

FIG. 1 is a schematic of an AR system 100, in accordance with some embodiments. AR system 100 is an example of digital light processing (DLP) system that includes an LED source 105, coupling optics 110 and microdisplay 115. Microdisplay 115 may be a deformable micromirror device (DMD), for example. The area of the microdisplay 115 multiplied by the acceptance angle sets the etendue of system 100:

$$E_{system} = n^2 \pi A_p \sin^2 \theta_s \quad (1)$$

As one example, microdisplay 115 may have a diagonal dimension of less than 0.3" with an acceptance angle $\theta_s$ of around 6°. A lighting (illumination) system that does not match this etendue wastes light and the power required for its generation. The etendue of LED source 105 may be modeled as:

$$E_{LED} = n^2 \pi A_L \sin^2 \theta_L \quad (2)$$

As one example, LED source 105 may comprise an LED array having an emissive surface area $A_L$ of 1200 µm×600 µm. Coupling optics 110 limits the effective half-emission cone angle $\theta_L$ to some value less than a lambertian radiation distribution (e.g., 65°), as a function of lens quality and system geometry. In accordance with some exemplary embodiments, super-lambertian LED source 105 has a half-emission cone angle no greater than the collection angle associated with coupling optics 110 such that no emitted light is wasted. In some such embodiments, super-lambertian LED source 105 has a half-emission cone angle less than 40°, and advantageously no more than 30°. With LED source 105 emitting a super-lambertian distribution, the angle over which emitted light is to be collected by coupling optics 110 is reduced relative to a lambertian LED source. The smaller emission cone angle of LED source 105 enables smaller and/or less expensive coupling optics. As evident from Eq. (2), the angle over which emitted light is to be collected by coupling optics 110 also increases with the emission area of LED source 105. Hence, a smaller native LED etendue also facilitates the use of a larger LED emission area within LED source 105 for given optics 110. Larger LED emission areas advantageously increase system luminance. Absent a super-lambertian distribution, coupling optics 110 would be limited to collecting a smaller portion of light output, leading to lower luminance levels and/or excessive source power consumption.

Figure 2:
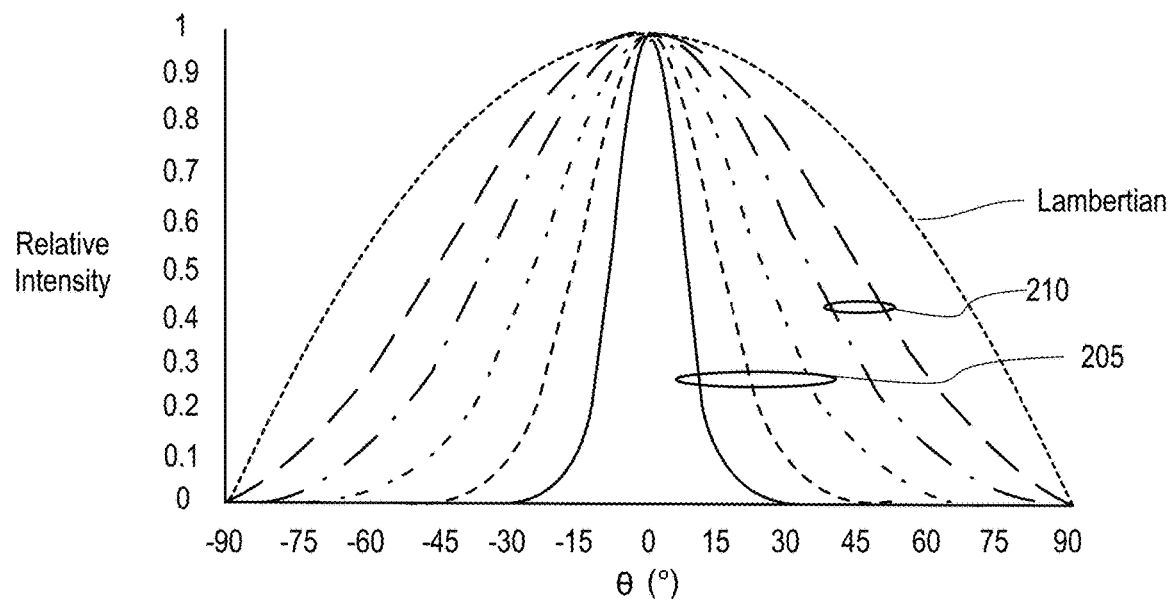
FIG. 2 is a graph illustrating radiation intensity as a function of cone angle for various embodiments compared to a lambertian radiation pattern.

FIG. 2 is a graph illustrating relative radiation intensity distribution as a function of half-emission cone angle for lambertian and super-lambertian LED sources. For a lambertian source, $f(\theta) = \cos \theta'$ and efficiency $\eta = \sin^2 \theta_L$. For a super-lambertian LED source, the radiation pattern may be represented by the following model:

$$f(\theta) = \frac{I(\theta)\cos\theta}{\int_{4\pi} I(\theta)\sin\theta d\theta}, \quad (3)$$

where $$I(\theta) = g_{11}\left[\exp\left(-\ln(2)\left(\frac{\theta + g_{21}}{g_{31}}\right)^2\right) + \exp\left(-\ln(2)\left(\frac{\theta - g_{21}}{g_{31}}\right)^2\right)\right] + \quad (4)$$
$$g_{12}\exp\left(-\ln(2)\left(\frac{|\theta| + g_{22}}{g_{32}}\right)^2\right),$$

and $\theta \in [-90, 90]$, $g_{11} = 0.1$, $g_{31} = g_{32} = g_{21} \in [2.5, 120]$,
$g_{12} = 1$, $g_{22} = 0$.

Exemplary patterns generated using Eq. (4) are shown in FIG. 2 for different values of $g_{21}$. Curves 205 have a full width at half maximum (e.g., relative intensity of 0.5) that is less than 40°, in accordance with some exemplary embodiments. While curves 210 are also super-lambertian, the greater half-emission cone angles (e.g., exceeding 45° and even 60°) may still result in a significant etendue mismatch between the source and microdisplay. Notably, the smaller half-emission cone angles in accordance with embodiments herein nevertheless maintain a considerably larger etendue than can be expected of a laser source. While a laser source etendue is much smaller than that of a microdisplay having dimensions on the order of the example provided above in the context of Eq. 1, a laser source's high spatial collimation can often induce speckling and poor color distribution at the microdisplay. To address these problems, etendue of a laser source might need to be expanded an it can be difficult to achieve expansion sufficient to despeckle while still matching the etendue of a microdisplay.

The reduction in power consumption for a super-lambertian LED source achieving a given luminance relative to a lambertian LED source may be estimated beginning with the LED luminance $L_L$ (cd/m$^2$):

$$L_L(\theta) \equiv \frac{\partial^2 \Phi}{\partial A_{projected} \times \partial \Omega}, \quad (5)$$

where $\Phi$ is the luminous flux (lumens), $\theta$ is the angle measure from normal to the LED emission surface, the projected area $A_{projected}$ is equal to $A_L \cos(\theta)$ for the lambertian distribution, and $\Omega$ is the solid angle. If it is assumed uniform light emission over the surface area of an LED, Eq. (5) may be integrated to arrive at the total flux emitted from the LED and captured by the system as:

$$\Phi = 2\pi A_L \times \int_0^{\theta_L} L_L(\theta) \cos \theta \sin \theta d\theta. \quad (6)$$

The luminance is given by:

$$L_L(\theta) = \frac{I(\theta)}{A_L \cos\theta} = \frac{I(0)f(\theta)}{A_L \cos\theta} = B(0)\frac{f(\theta)}{\cos\theta}, \quad (7)$$

where $I(\theta)$ is the luminous intensity (candela), $I(0)$ is the on-axis luminous intensity (candela), $B(0)$ is equal to $I(0)/A_L$ as the on-axis brightness (cd/m$^2$), and $f(\theta)$ is the normalized radiation pattern for the LED. Combining Eq. (6) and Eq. (7) the total useful source luminous flux is calculated as:

$$\Phi_{useful} = 2\pi A_L B(0) \int_0^{\theta_L} f(\theta) \sin \theta d\theta. \quad (8)$$

The total flux emitted by the LED is given by:

$$\Phi_{total} = 2\pi A_L B(0) \int_0^{\pi/2} f(\theta) \sin \theta d\theta. \quad (9)$$

The system efficiency is then determined as:

$$\eta = \frac{\Phi_{useful}}{\Phi_{total}} = \int_0^{\theta_L} f(\theta) \sin\theta d\theta \bigg/ \int_0^{\pi/2} f(\theta) \sin\theta d\theta, \quad (10)$$

which is also known as the 'directionality' of the LED source. The power reduction gain can be expressed as:

$$\text{Power Reduction} = \sin^2\theta_L \int_0^{\pi/2} f(\theta) \sin\theta d\theta \bigg/ \int_0^{\theta_L} f(\theta) \sin\theta d\theta \quad (11)$$

Using the etendue of the source as provided in Eq. (2), and the etendue conservation principle:

$$\theta_L = \sin^{-1}\sqrt{\frac{A_{projected} \times \theta_s}{\eta^2 \times A_L}}. \quad (12)$$

Figure 3:
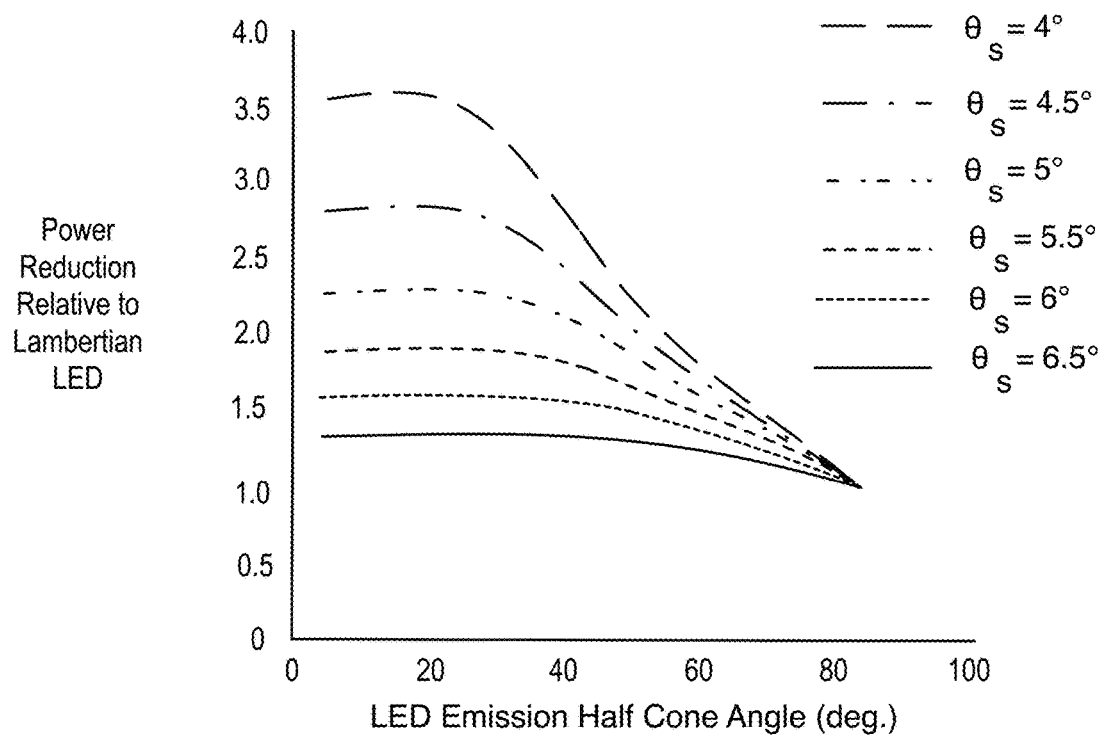
FIG. 3 is a graph illustrating modeled power reduction for a super-lambertian source relative to a lambertian source in a DMD display for various acceptance angles.

FIG. 3 is a graph illustrating power reduction modeled according to Eq. (12) for a super-lambertian source relative to a lambertian source in a DMD display for various acceptance angles $\theta_s$ ranging from ±4 to 6.5° typical for a DMD with a diagonal dimension in the range of 0.21"-0.3" and a LED area the exemplary LED area $A_L$ of 1200 μm×600 μm. In FIG. 3 efficiency of the system is plotted as a function of the half-cone emission angle of various LED sources, including super-lambertian and a lambertian source. As shown, the smaller the system acceptance angle $\theta_s$, the greater the power reduction of the super-lambertian LED source. As also shown in FIG. 3, maximum power reduction is achieved for a half-cone emission angle between 20° and 40°. For exemplary embodiments with a LED half-cone emission angle of less than 40°, one can achieve a power reduction factor of 2-3 for acceptance angles $\theta_s$ of 5°, or less.

Figure 4A:
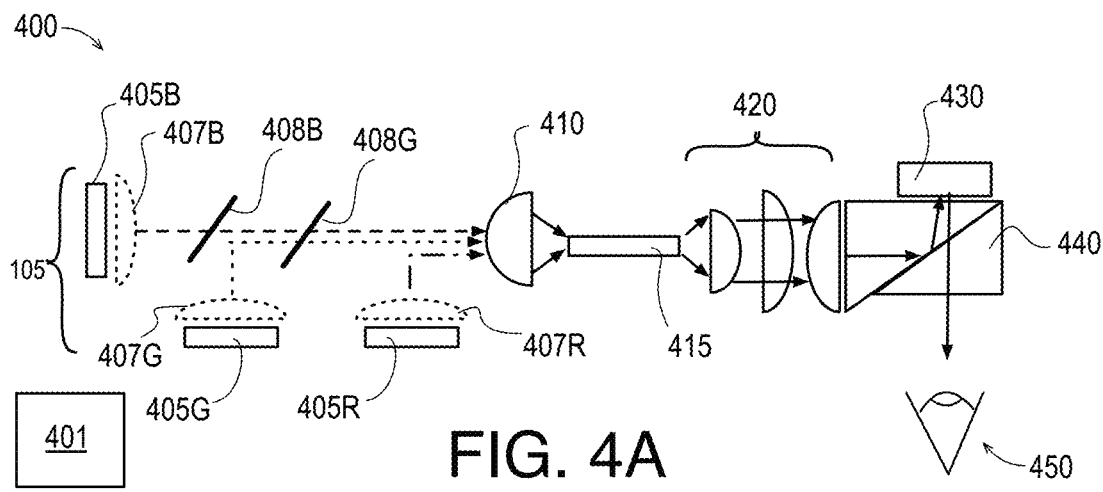
FIG. 4A is a schematic of an augmented reality display employing an LED source having a super-lambertian radiation pattern, in accordance with some embodiments.

In some embodiments, an augmented reality device includes a super-lambertian LED source, coupling optics, and a computer processor configured to provide image data for display. FIG. 4A is a schematic of an AR display device 400 employing one or more LED source 105 having a super-lambertian radiation pattern, in accordance with some embodiments. AR display device 400 may be implemented in any suitable form factor, but not limited to, a headset, smart eyeglasses, or monocle. LED source 105 includes a blue LED source 405B (λ≈450-495 nm), a green LED source 405G (λ≈495-570 nm), and a red LED source 405R (λ≈620-750 nm). Each of LED sources 405B, 405G and 405R may include one or more LED having a super-lambertian radiation pattern. Alternatively, sources 405B, 405G, and 405R may be provided as a single RGB array including LEDs having super-lambertian radiation patterns. Coupling optics may comprise one or more discrete collimating lenses 407B, 407G, and 407R. Within device 400, collimating lenses 407B, 407G, and 407R are denoted in dashed line to emphasize that such lenses may be advantageously omitted in some embodiments of device 400, for example where the etendue of LED source(s) 405 is sufficiently small, as further described below. Coupling optics may further comprise dichroic filters 408B and 408G (e.g., for beam steering and/or conditioning, a condenser lens (stack) 410, and an optical integrator 415 to improve spatial color distribution uniformity. Optical integrator 415 may be any glass rod or hollow tube mirror wall integrator known in the art to be suitable for spatially randomizing the input light. Alternatively, any lens-array type integrator known to be suitable for the application may be employed. The optical path is completed with reflective and/or refractive relay optics 420 and a total internal reflection (TIR) prism 440. Prism 440 is optically coupled to DMD 430, which is an exemplary embodiment of microdisplay 115 (in FIG. 1). DMD 430 may receive image data, from one or more computer processor 401 and, in response to the image data, may reflect pixels of projected light through prism 440 to generate an augmented reality viewport. DMD 430 thereby provides an image to a user eye 450.

Figure 4B:
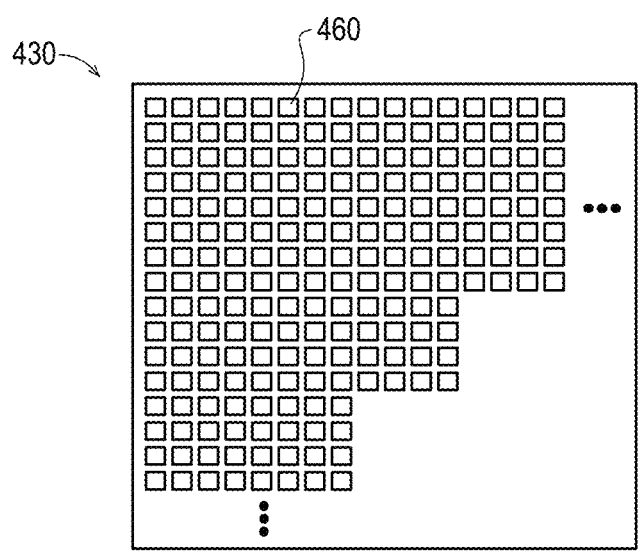
FIG. 4B is an expanded plan view of a DMD, in accordance with some embodiments.
Figure 4C:
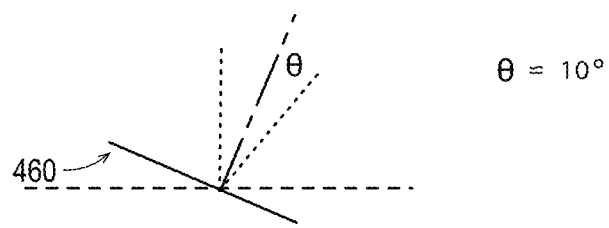
FIG. 4C is a graph illustrating micro mirror rotation, in accordance with some embodiments of the DMD illustrated in FIG. 4B.

FIG. 4B is an expanded plan view of DMD 430, in accordance with some embodiments. Non-limiting examples of DMD 430 include a deformable micromirror device, also referred to as a digital micromirror display. DMD 430 includes an array of mirrors 460 with each mirror corresponding to an individual pixel element of the display. Each mirror 460 is configured to tilt about an axis in response to an electrical signal applied thereto, for example derived from virtual image data provided by processor 401. FIG. 4C is a graph illustrating micro mirror rotation, in accordance with some embodiments of DMD 460. In this example, mirror 460 may tilt approximately +/−10° with respect a plane that is perpendicular to the plane of mirror 460 through the tilt axis. In further reference to device 400 (FIG. 4A), one mirror orientation (e.g., +10° corresponds to a pixel "ON" state and the other mirror orientation (e.g., −10°) corresponds to a pixel "OFF" state. The half beam angle of light striking the DMD is to be no more than the tilt angle of the mirror (e.g. a 10° half beam angle) so that light from an OFF pixel does not enter the augmented reality viewport.

Figure 5:
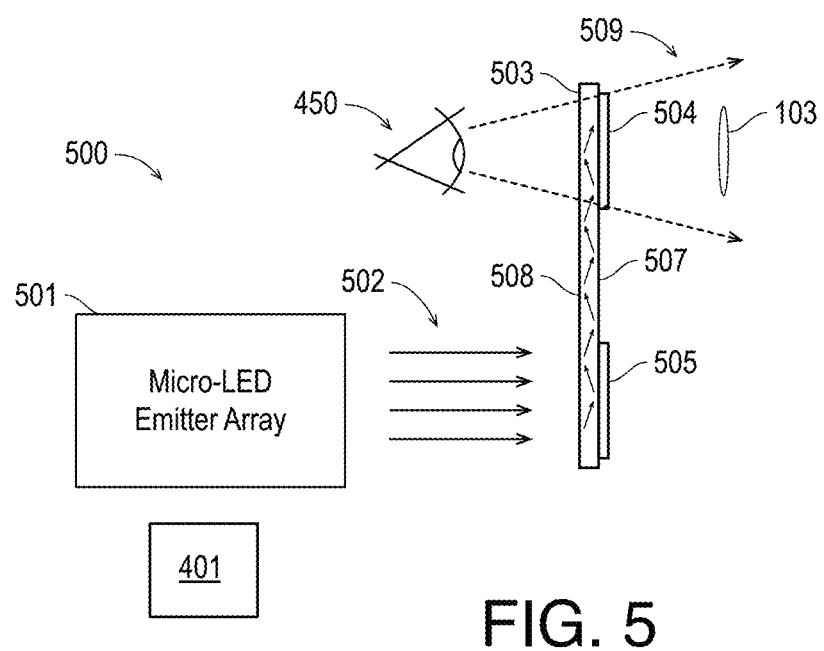
FIG. 5 is a schematic of an augmented reality display employing an LED source having a super-lambertian radiation pattern, in accordance with some embodiments.

A super-lambertian source in accordance with embodiments may also be implemented in AR devices architectures. For example, augmented reality optics may instead include an LED source, a waveguide, and holographic beam splitters. Such an AR device may also be implemented in any suitable form such as a headset, smart glasses, or the like. FIG. 5 is a schematic of another exemplary AR display device 500 employing an LED source having a super-lambertian radiation pattern, in accordance with some alternative embodiments. As shown in FIG. 5, device 500 may include a LED source 501 comprising an array of LEDs having super-lambertian radiation distributions. Individual LEDs within LED source 501 may be separately driven by signals responsive to image data processed by processor 401. The resulting emissive display is then piped to an AR viewport. In device 500 optical coupling is provided by an optical waveguide 503, and holographic beam splitters 504, 505 disposed on opposite ends of waveguide 503. LED source 501 may provide a red-green-blue projected image 502 to waveguide 503. Projected image 502 may be associated with an etendue of LED source 501 that is matched to that of waveguide 203, for example so that no light is lost substantially as described in the context of FIG. 1. Projected image 502 may enter the end of waveguide 503 having holographic beam splitter 504 via side 508 of waveguide 503 and projected image 502 may be transmitted by waveguide 503 (e.g., via internal reflection) to holographic beam splitter 505 such that virtual image 203 is imaged within a viewport 509. Computer processor 401 may generate image data for display to user eye 450 using any technique known in the art.

Figure 6A:
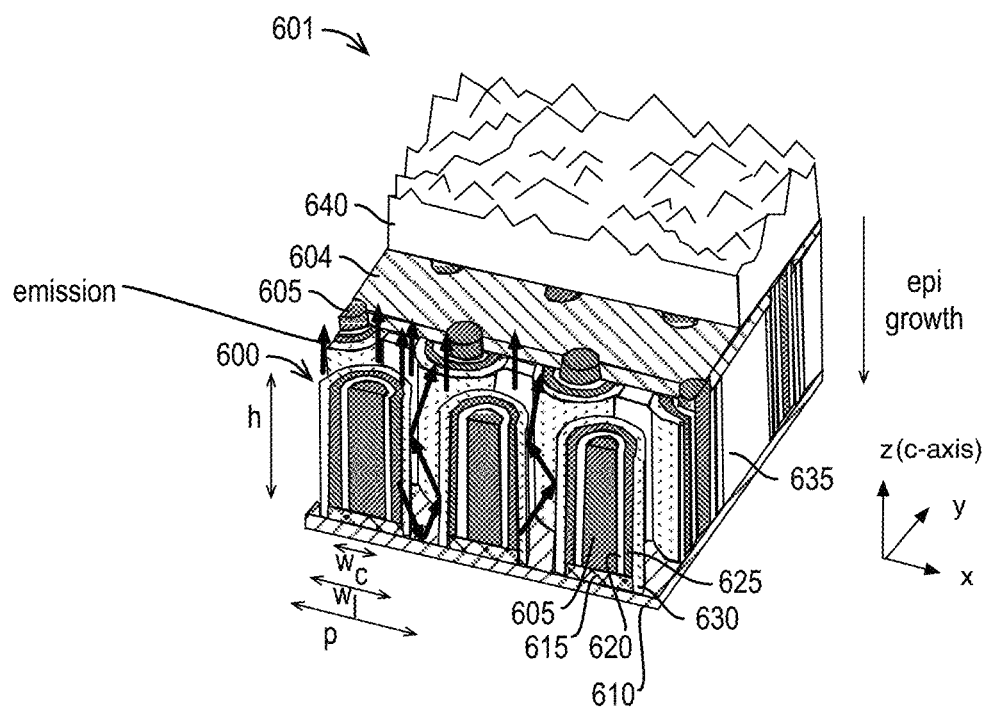
FIG. 6A is a cross-sectional isometric view of an exemplary super-lambertian LED source structure, in accordance with some embodiments.

In some embodiments, a super-lambertian LED source includes an array of nanowire LEDs. Such an array may have an area $A_L$, of 1200 μm×600 μm, as one example. FIG. 6A is a cross-sectional isometric view of an exemplary super-lambertian LED source structure 601, in accordance with some nanowire LED embodiments. As shown LED source structure 601 includes a 2D spatial array of nanowire LEDs 600. Each LED 600 may have lateral (x-y plane) dimensions of tens of microns, or less. Therefore, LEDs 600 may be considered micro-LEDs (pLEDs). LEDs 600 are advantageously inorganic and may emit over different wavelength bands such that a red-green-blue emission is output by LED source structure 601. Such RGB micro LED devices may be assembled from red, green, and blue micro light emitting diodes manufactured separately (e.g., fabricated on separate carriers and subsequently assembled using pick and place techniques or the like). Alternatively, such RGB micro LED devices may be manufactured on the same substrate by selective growth of emission layers for the respective red, green, and blue LEDs. Such LEDs may then be directly bonded to a driver circuit back plane using direct bonding techniques. Alternatively, a plurality of LED source structures 601 may be integrated into an AR device, with each LED source structure 601 emitting primarily over one particular color band (e.g., R, G, or B).

Each nanowire LED 600 includes a core 605 with a plurality of cladding layers forming sheaths over core 605. Core 605 may function as a first charge carrier transport layer. In some embodiments core 605 is n-type semiconductor and functions as an electron transport layer. An active emission layer 620 is clad over core 605, and a second charge carrier transport layer 625 is clad over emission layer 620. Transport layer 625 is of a complementary semiconductor type as core 605. In some embodiments where core 605 is n-type, transport layer 625 is p-type and therefore a hole transport layer. In exemplary embodiments, core 605 is crystalline, having hexagonal lattice structure with the c-axis parallel to the z-axis in FIG. 6A. Core 605 has a transverse width $w_c$ in the x-y plane. In accordance with some advantageous embodiments, core width $w_c$ is between 70 nm and 150 nm. In some such embodiments, core 605 is a III-N material. In exemplary n-type embodiments, core 605 is n-type doped gallium nitride (nGaN). Emission layer 620 may also be crystalline (e.g., hexagonal lattice structure) and may be epitaxial to core 605 (i.e., having the same lattice orientation). Active emission layer 620 may include one or more layers of indium gallium nitride (InGaN) and one or more layers of gallium nitride (GaN), for example. A heteroepitaxial stack of such layers may form any suitable multiple quantum well (MQW) structure. Different MQW structures and/or different InGaN compositions may render LEDs 600 operable to emit over different wavelength bands. In some embodiments, indium concentration in emission layer 620 is about 41% to provide red emission. In some other embodiments, indium concentration in emission layer 620 is about 37% to provide a green emission. In some other embodiments, indium concentration in emission layer 620 is about 20% to provide a blue emission. Transport layer 625 may similarly include any suitable material or materials. In an embodiment, transport layer 625 is also crystalline (e.g., hexagonal) and may be epitaxial to core 605 (i.e., having the same lattice orientation). In some embodiments, transport layer 625 p-type doped gallium nitride (pGaN). Emission layer 620 and transport layer 625 may have a film thickness less than the core width $w_c$. In some exemplary embodiments, emission layer 620 has a thickness less than 500 nm and transport layer 625 has a thickness less than 500 nm.

As further illustrated in FIG. 6A, an electrode layer 630 is clad over transport layer 625. Electrode layer 630 may be electrically coupled to a reflective material layer 610 that may also be electrically conductive to tie all nanowire LEDs 600 to a first reference potential during operation. In some exemplary embodiments, electrode layer 630 is optically transmissive (i.e., non-opaque) at least within the band emitted by the LED allowing for light generated within emission layer 620 to escape along the entire length of nanowires 600. For such embodiments, electrode layer 630 may be a conductive oxide, such as, indium tin oxide (ITO). Electrode layer 630 may also be other materials known to have similar electrical conductivity and optical transmissivity. In some exemplary embodiments, electrode layer 630 has a thickness less than 500 nm. Nanowire LED 600 may therefore have a total width $w_l$ that is between 0.9 and 1.0 μm.

Emitted light is illustrated in FIG. 6A by heavy arrows. As shown, radial emission along the longitudinal length h, which may have near lambertian characteristics exiting electrode layer 630, is limited by the solid angle associated with the aspect ratio of nanowire LED 600 and the pitch p of the nanowire LED array. In some exemplary embodiments where a nanowire LED 600 has an LED width $w_l$ of 0.9-1.0 µm, the nanowire array has a pitch p of 1-1.5 µm. As such, the spacing between two adjacent electrode layers 630 may range from 0.1-0.5 µm. Emission not sufficiently aligned with the z-axis in FIG. 6A is not simply lost, but rather may be optically reflected by material interfaces between adjacent nanowire LEDs, as well as by reflective material layer 610. Composition of a dielectric backfill material 635 may, for example, be selected to provide a desirable index contrast with electrode layer 630. Accordingly, and as illustrated in FIG. 6A, interfaces associated with a first nanowire may reflect light emitted by a second, adjacent, nanowire.

As further illustrated in FIG. 6A, a non-emitting end of nanowire LED 600 interfaces with optically reflective material layer 610. The portion of light emitted by nanowire LED 600 that propagates toward reflective material layer 610 is to be optically redirected along a return path toward the emitting end of the nanowire that interfaces with growth mask material 604. Growth mask material 604 is advantageously an optically transmissive material, such as any dielectric material having a suitable refractive index. As noted above, reflective material layer 610 may be electrical conductor that is further operable to electrically couple the electrode layer 625 of each nanowire LED 600 in electrical parallel to a driver voltage potential. A passivation layer 615 may electrically insulate core 605 from reflective material layer 610. Passivation layer 615 may be a dielectric of any composition. Reflective material layer 610 may be any metal, such as, Cu, Al, Ag, etc.

Light propagating along a path between adjacent LEDs 600 will be confined to exit angle satisfying the solid angle defined by the 3D structure of the nanowire LEDs, thereby achieving a super-lambertian distribution pattern at the emission surface of LED source structure 601. Core 605 has a longitudinal length or height h extending in the z-axis in FIG. 6A. Core height h may advantageously exceed the core width $w_c$ by at least a factor of five, more advantageously exceed the core width $w_c$ by at least an order of magnitude, and may even be 20 times the core width $w_c$. LED height is h is preferably no less than twice LED width $w_l$, advantageously at least three times LED width $w_l$, and more advantageously at least five times LED width $w_l$. As described further below, the high aspect ratio (e.g., 10:1-20:1 for core 605, and/or 3:1-5:1 for LED 600) may ensure the fully clad nanowire LED 600 has sufficient aspect ratio for a given LED pitch to achieve the desired super-lambertian emission distribution. Nanowire LED aspect ratio and/or nanowire LED pitch may be tuned to achieve a desired radiation pattern from LED source structure 601 (e.g., <40°, <30°, etc.).

As further illustrated in FIG. 6A, core 605 extends through growth mask material 604 to a template material 640. Template material 640 may provide a seeding surface for epitaxial growth of core 605. Template material 640 may also be operable as a semiconductor electrode coupling each of semiconductor cores 605 to a voltage potential relative to that of electrode layer 630. Template material 640 may be impurity doped to match the conductivity type of core 605 (e.g., n-type) and may also be crystalline (e.g., hexagonal lattice). Template material 640 is advantageously optically transmissive at least within a band emitted by nanowire LEDs 600. In some embodiments template material 640 is a III-N material, such as, but not limited to GaN. Template material 640 may further include one or more buffer material layers (not depicted) having any composition and layer structure known in the art to facilitate epitaxial growth of core 605. Template material 640 may have any suitable emission surface texture (e.g., random) and include any optical surface coatings known (e.g., anti-reflective, etc.). As noted in FIG. 6A, the epitaxial growth direction of core 605 is along the c-axis, but in the direction opposite that of light emission. Formation of the various cladding layers illustrated in FIG. 6A may be grown on core 605, for example using any growth technique known to be suitable for lateral growth over growth mask material 604. For a more detailed description of fabrication processes suitable for the manufacture of nanowire LEDs 600, the interested reader is referred to commonly owned and assigned U.S. patent application Ser. No. 15/381,943 filed on Dec. 12, 2016 and titled "Micro Wall Light Emitting Diodes."

In some embodiments, a super-lambertian LED source includes a monolithically integrated metamaterial lens. Such a metamaterial lens may include patterned features having dimensions smaller than the wavelength band emitted by the LED source. Such features may be defined, for example, through lithography processes employing exposure wavelengths significantly smaller than those of the RGB bands emitted by the exemplary LED source. In some embodiments, the metamaterial lens is operative as a monolithic optical collimator of the LED emission. Metamaterial lenses are generally composed of two-dimensional arrays of sub-wavelength scatterers that may modify one or more of the wavefront, polarization, or amplitude of light emitted by one or more LED of an LED source.

Figure 6B:
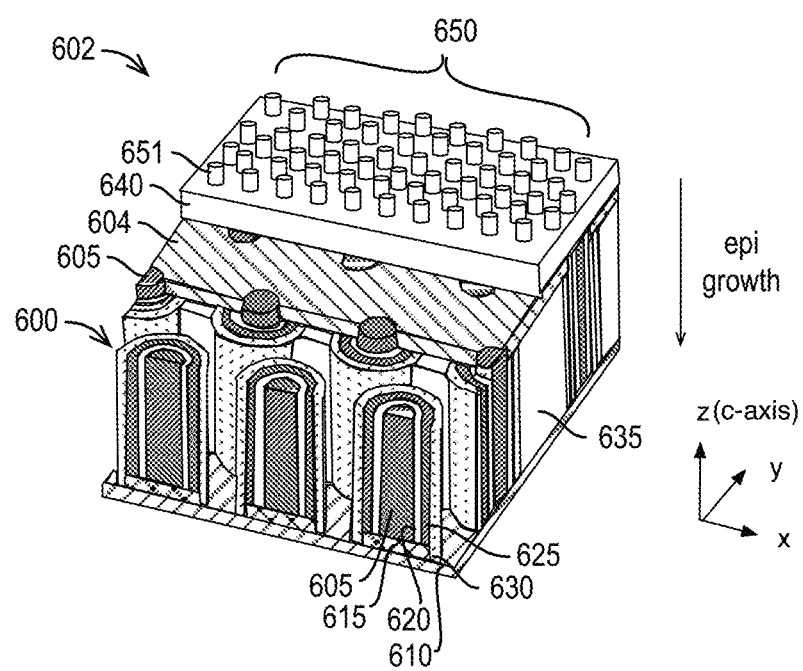
FIG. 6B is a cross-sectional isometric view of an exemplary super-lambertian LED source structure, in accordance with some embodiments.

In some embodiments, a metamaterial lens is monolithically integrated with a nanowire LED source. FIG. 6B is a cross-sectional isometric view of an exemplary super-lambertian LED source structure 602, in accordance with some embodiments. LED source structure 602 includes an array of nanowire LEDs 600 substantially as described in the context of LED source structure 601 (FIG. 6A). LED source structure 602 further includes a monolithically integrated metamaterial lens 650. In the illustrated embodiment, metamaterial lens 650 is in contact with template material 640. Although monolithic integration is advantageous, metamaterial lens 650 may of course also be implemented as a discrete optic in place of a conventional spherical or aspherical collimation lens.

Metamaterial lens 650 may comprise features 651 having any structure and composition suitable for varying the refractive index relative to regions surrounding features 651 as needed to collimate a particular band light emitted from LEDs 600. In some embodiments, features 651 are silicon, titanium oxide, gallium phosphide, or diamond. However, any material known to be suitable for the purpose may be employed. Features 651 may be of crystalline or amorphous material. Features 651 may have any suitable cross-sectional shape (i.e., x-y footprint), such as, but not limited to, circular, oval, square, rectangular, a cross-hatch, a boomerang shape, or the like. Features 651 may have any suitable dimensions. The dimensions of nanoparticles of metamaterial lenses may be based on the wavelength of light the metamaterial lens is to condition. In an embodiment, features 651 may have a height (e.g., in the z-dimension) of about the wavelength of light divided by two, and a lateral length of about the wavelength of light divided by about 5-10. Features 651 may be repeated across the metasurface at a pitch of about the wavelength of light divided by two. Hence, for red emission, features 651 may have a length in the range of about 60 to 150 nanometers, and a pitch and/or height in the range of about 300 to 400 nanometers. For green emission, features 651 may have an overall length in the range of about 45 to 120 nanometers, and a pitch and/or height in the range of about 250 to 300 nanometers. For blue emission, features 651 may have an overall length in the range of about 40 to 120 nanometers, and a pitch and/or height in the range of about 200 to 250 nanometers. Features 651 may therefore have a high aspect ratio (height to width) of 2.5, or more. Feature shape, along with the size of each feature and the spacing or pitch of the features may be adjusted as needed to further collimate light emitted by LED source structure 602.

Figure 7:
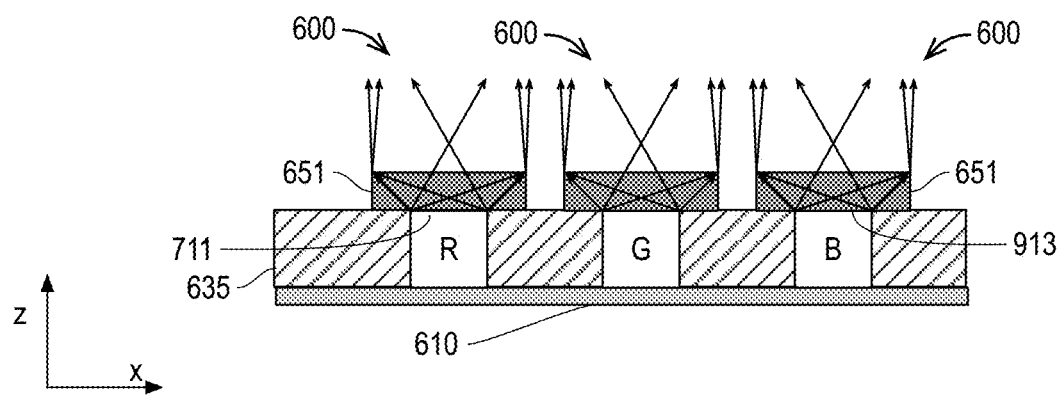
FIG. 7 is a cross-sectional view of an exemplary super-lambertian LED source structure, in accordance with some alternative embodiments.

FIG. 7 is a cross-sectional view of an exemplary super-lambertian LED source structure, in accordance with some embodiments employing an integrated metamaterial lens. In FIG. 7, nano-wire LEDs 600 have an emissive surface 711. Metamaterial lens features 651 are located over emissive surfaces 711 and/or over portions of dielectric backfill material 635. Collimation by metamaterial lens features 651 is further illustrated in FIG. 7. Metamaterial lens features 651 may collimate light emitted from LEDs 600 to have a narrower half-emission cone angle than may otherwise be emitted at surface 711. For example, nanowire LEDs 600 may be associated with a first super-lambertian emission distribution, and light exiting source structure 602 (FIG. 6B) may have a second super-lambertian emission distribution smaller than the first distribution. Furthermore, such collimation may be achieved without substantial energy loss by metamaterial lens features 651. Metamaterial lens 650 and nano-wire LEDs 600 may provide source structure 601 with an etendue sufficiently well matched to a microdisplay that a discrete collimation lens (e.g., collimator 407 in FIG. 4A) may be unnecessary and advantageously excluded from the optical path of an AR device.

Figure 8:
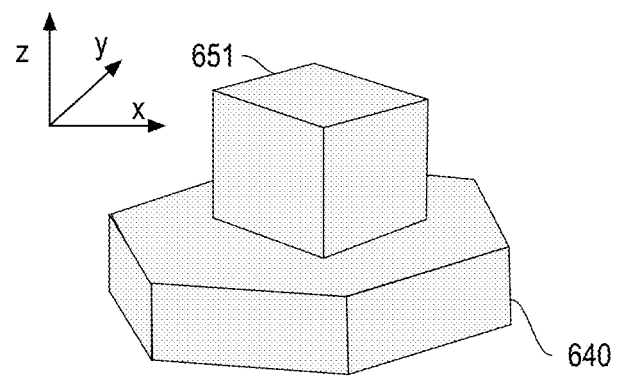
FIG. 8 is a isometric view of an exemplary metamaterial lens feature, in accordance with some alternative embodiments.

FIG. 8 illustrates metamaterial lens features 651 in accordance with a rectangular cuboid embodiment. Within a metamaterial lens 650, features 651 arrayed over an emissive surface of the LED source may have fixed dimensions, and/or orientation and arranged in a fixed or variable pitch grid pattern. Many metamaterial lensing techniques and structures are possible, and some are known to be well-suited to collimation. The interested reader is referred to the more detailed discussion provided in commonly owned and assigned U.S. patent application Ser. No. 15/381,932 filed on Dec. 12, 2016 and titled "Display Device Having Integrated Metamaterial Lens."

Figure 9:
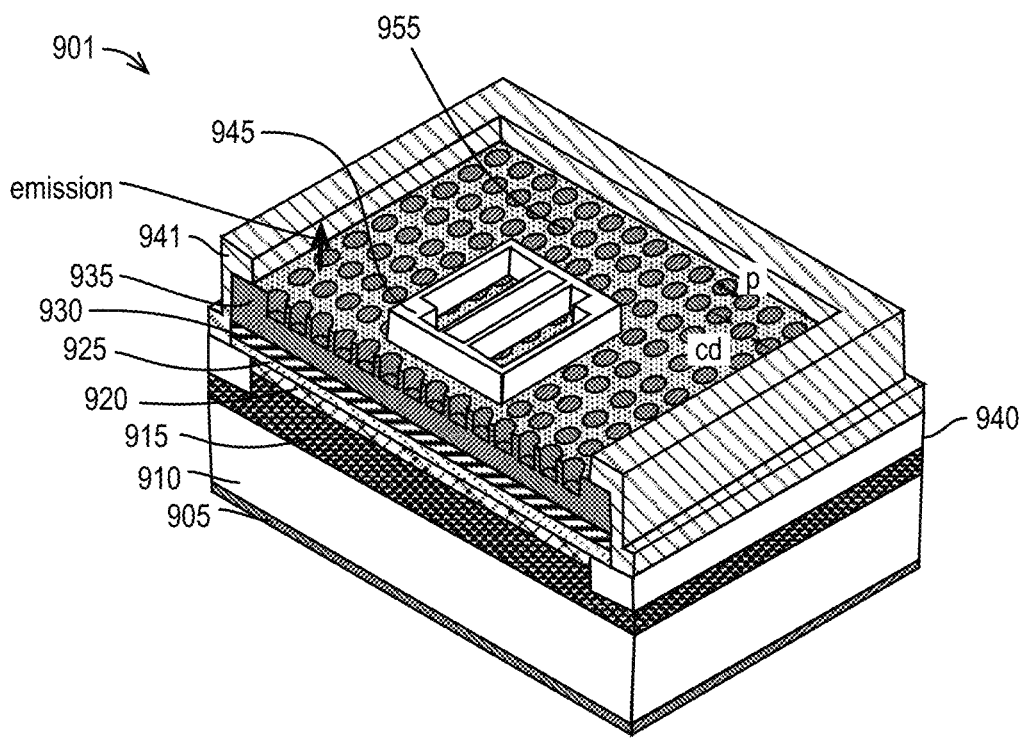
FIG. 9 is a cross-sectional isometric view of an exemplary super-lambertian LED source structure, in accordance with some alternative embodiments.

In some embodiments, a super-lambertian LED source structure includes a photonic crystal. A photonic crystal may be patterned to have periodicity on the order of the emission wavelength. FIG. 9 is a cross-sectional isometric view of an exemplary super-lambertian LED source structure 901, in accordance with some 2D photonic crystal embodiments. In LED source structure 901, an LED semiconductor layer is integrated with a photonic crystal. As shown in FIG. 9, a semiconductor substrate layer 910 of a first conductivity type (e.g., p-type) interfaces with a first contact metallization (e.g., p-contact) 905. Semiconductor substrate layer 910 may, for example, be a silicon semiconductor substrate of suitable conductivity. A bonding layer 915 interfaces semiconductor layer 910. Bonding layer 915 may be any suitable material, is advantageously electrically conductive, and forms a good bond with semiconductor layer 910 through a bonding process such as, but not limited to, thermal compression bonding. Bonding layer 915 may be gold (Au), for example. An optically reflective layer 920 interfaces with bonding layer 915. Optically reflective layer 920 may also be a good electrical conductor. Optically reflective layer 920 may be a metal, such as, but not limited to silver (Ag), aluminum (Al), or copper (Cu). Any LED semiconductor stack known to be suitable for emitting at the visible wavelengths (e.g., RGB) may be disposed over reflective layer 920. In some embodiments, the LED semiconductor stack includes a first semiconductor charge carrier transport layer 925, an emission layer 930 and, a second semiconductor charge carrier transport layer 935. In some such embodiments, semiconductor layers 925-930 are all III-N materials. Transport layer 925 may have a first conductivity type (e.g., p-type). In some embodiments, transport layer 925 is doped gallium nitride (pGaN), having hexagonal lattice structure. Emission layer 930 may also be crystalline (e.g., hexagonal lattice structure) and may be epitaxial to transport layer 925.

Emission layer 930 may include one or more layers of indium gallium nitride (InGaN) and one or more layers of gallium nitride (GaN), for example. A heteroepitaxial stack of such layers may form any MQW structure. Different MQW structures and/or different InGaN compositions may render LED source structure 901 operable to emit over different wavelength bands. In some embodiments, indium concentration in emission layer 930 is about 41% to provide red emission. In some other embodiments, indium concentration in emission layer 930 is about 37% to provide a green emission. In some other embodiments, indium concentration in emission layer 930 is about 20% to provide a blue emission. Transport layer 935 may similarly include any suitable material or materials. In an embodiment, transport layer 935 is also crystalline (e.g., hexagonal) and may be epitaxial to emission layer 930. In some embodiments, transport layer 935 is of complementarily conductivity type as transport layer 925. Transport layer 935 may be n-type doped gallium nitride (nGaN), for example. Emission layer 930 and transport layers 925, 935 may have any film thickness known to be suitable for the application. In some exemplary embodiments, emission layer 930 has a thickness less than 1000 nm and transport layers 925, 935 have thicknesses less than 1000 nm.

LED source structure 901 further includes a second electrode 945, and dielectric isolation layers 940, 941. Electrode 945 may be any metal or optically transmissive material known to be suitable for making electrical connection to transport layer 935. In some embodiments, electrode 945 is a metal that provides a good ohmic or rectifying contact to n-type semiconductors, such as nGaN. In some embodiments, electrode 945 is a metal that provides a good ohmic or rectifying contact to p-type semiconductors, such as pGaN. In some embodiments, electrode 945 is an optically transmissive material, such as ITO or other suitably conductive metal oxide. Dielectric layers 940, 941 have any composition known to be suitable for the application.

LED source structure 901 includes at least one photonic crystal structure and is operable as a super-lambertian LED source. In the illustrative embodiment, semiconductor transport layer 935 is patterned into a photonic crystal. In this example, a partial thickness of semiconductor transport layer 935 (e.g., nGaN) is etched to form 2D array of features 955. Within the 2D photonic crystal, the array of features 955 have a fixed pitch p and fixed dimension cd, where each may be on the order of the wavelength of light emitted by LED source structure 901. A backfill material (not depicted) may be deposited into features 955 to induce a periodic variation in the refractive index according to the array of features 955. Such a photonic crystal may be operable to reduce the emission cone angle of an LED source. Depending on parameters of the photonic crystal (e.g., feature cd, p, depth, material refractive index contrast), the photonic crystal may be operable to condition the radiation of LED source structure 901. In some exemplary embodiments, the photonic crystal is operable to collimate radiation into a super-lambertian distribution.

Figure 10:
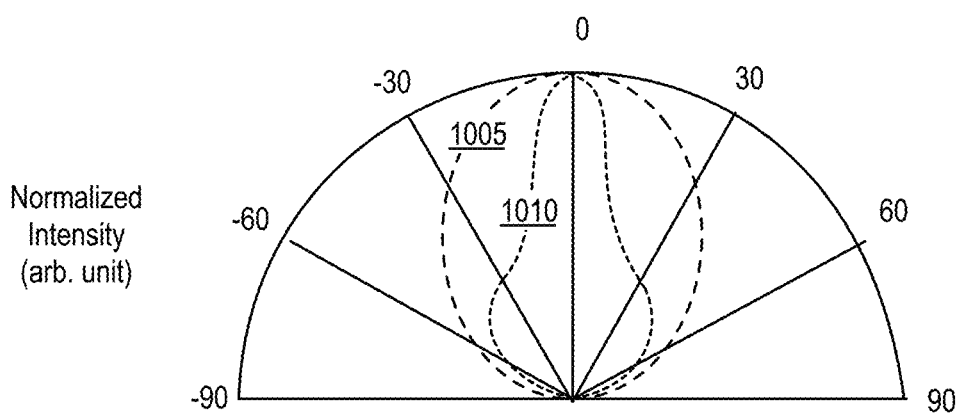
FIG. 10 is a graph illustrating a comparison of radiation patterns for the LED source structure illustrated in FIG. 9 compared to a lambertian LED source structure.

FIG. 10 is a graph illustrating a comparison of radiation patterns for the LED source structure illustrated in FIG. 9 compared to a lambertian LED source structure lacking the photonic crystal illustrated in FIG. 9. In FIG. 10, a normalized emission intensity of arbitrary units is plotted as a function of half-emission-cone-angle. Trace 1005 illustrates the lambertian emission distribution while trace 1010 illustrates the reduction in relative intensity for half-cone angles beyond about 10°.

Notably, while the photonic crystal structure illustrated in FIG. 9 is implemented in a semiconductor layer (e.g., transport layer 935), it may also be implemented in other material layers monolithically integrated into the LED source structure. For example, a photonic crystal may be fabricated in a dielectric layer deposited over an emission surface of the LED structure. A photonic crystal may be fabricated in an electrically conductive material layer further employed as one of the electrodes of the LED structure. For example, a photonic crystal may be fabricated from an ITO layer, or the like. A photonic crystal may also be fabricated in a semiconductor layer deposited over an emissive surface of an LED structure with the composition of the semiconductor layer selected for a desired index contrast.

In some embodiments, a super-lambertian LED source includes two or more of the features described above in the context of FIG. 6A-10. The various structures described above may be combined for additive effect, for example to reduce the half-emission-cone-angle to below 30° (e.g., 10°-30°) as needed to match etendue of the LED source to a microdisplay. Such combinations may eliminate the need for any discrete collimating lenses (e.g., 407B in FIG. 4A) in the optical path of an AR system.

In some embodiments, a super-lambertian LED source includes a photonic crystal integrated with a nanowire LED array. The photonic crystal may further collimate the radiation pattern of the nanowire LED array to further reduce the cone angle, if needed. In further reference to FIG. 6B, for example, metamaterial lens 650 may be replaced with a photonic crystal. For such embodiments, the photonic crystal structure illustrated in FIG. 9 may be implemented in an optically transmissive semiconductor layer, dielectric layer, or electrically conductive layer (e.g., ITO) deposited over the emission surface of the nanowire LEDs 600 shown in FIG. 6B.

A super-lambertian LED source may also include a metamaterial lens and a photonic crystal integrated with a nanowire LED array. In further reference to FIG. 6B, for example, the photonic crystal structure illustrated in FIG. 9 may be implemented in an optically transmissive semiconductor layer, dielectric layer, or electrically conductive layer (e.g., ITO) deposited over the emission surface of the nanowire LEDs 600 shown in FIG. 6B. Metamaterial lens 650 may then be fabricated over such a photonic crystal. A super-lambertian LED source may also include a metamaterial lens integrated with a photonic crystal-enhanced LED. In further reference to FIG. 6B, for example, the metamaterial lens 650 may be monolithically integrated into LED source structure 901 (FIG. 9). In some such embodiments, metamaterial lens 650 is fabricated in a material layer deposited onto LED source structure 901.

Figure 11:
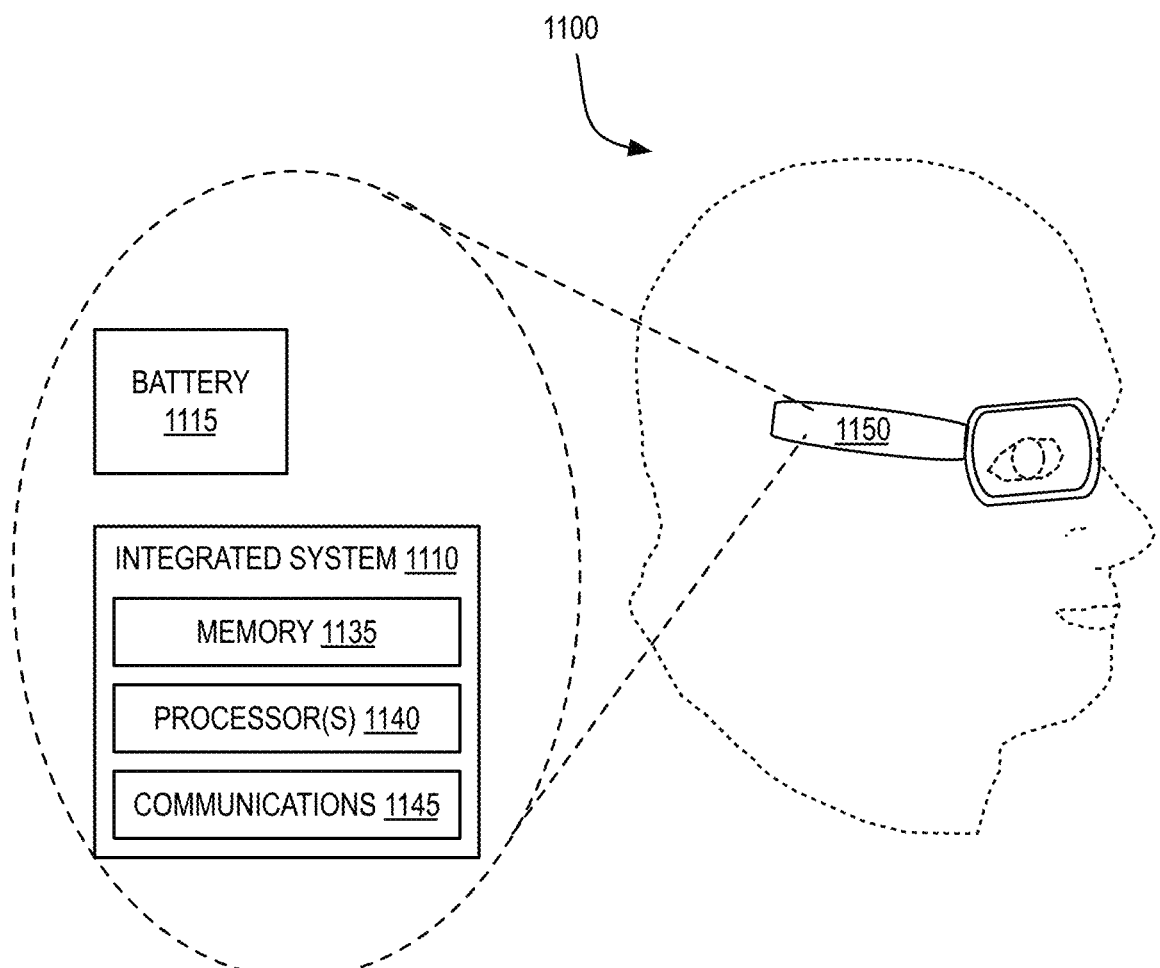
FIG. 11 illustrates an AR platform employing an emissive display device structure, in accordance with some embodiments.

FIG. 11 illustrates a system 1100 in which an AR platform 1105 employs an emissive display device structure, arranged in accordance with at least some implementations of the present disclosure. AR platform 1105 may include device 400 (FIG. 4A) or device 500 (FIG. 5), for example. AR platform 1105 may be any portable device configured for each of electronic data display, electronic data processing, wireless electronic data transmission, or the like. For example, although illustrated as a monocle, AR platform 1105 may have any headset form factor. While AR computing platform 1105 is an illustrative example, the LED source structures discussed herein may also be employed in other platforms such as, but not limited to, desktop computer, television, mobile phone, virtual reality device, or other wearable device of similar functionality.

AR platform 1105 includes a chip-level or package-level integrated system 1110 and a battery 1115. Integrated system 1110 may be implemented as discrete components (e.g., integrated circuits) or as a system on a chip and may include may include memory circuitry 1135 (e.g., random access memory, storage, etc.), processor circuitry 1140 (e.g., a microprocessor, a multi-core microprocessor, graphics processor, etc.), and communications circuitry 1145 (e.g., a wireless transceiver, a radio frequency integrated circuit, a wideband RF transmitter and/or receiver, etc.). The components of integrated system 1110 may be communicatively coupled to one another for the transfer of data within integrated system 1110. Functionally, memory circuitry 1135 may provide memory and storage for integrated system 1110 including image and/or video data for display by display device 1150, processor circuitry 1140 may provide high level control for mobile computing platform 1105 as well as operations corresponding to generating image and/or video data for display by display device 1150, and communications circuitry 1145 may transmit and/or receive data including image and/or video data for display by display device 1150. For example, communications circuitry 1145 may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 12:
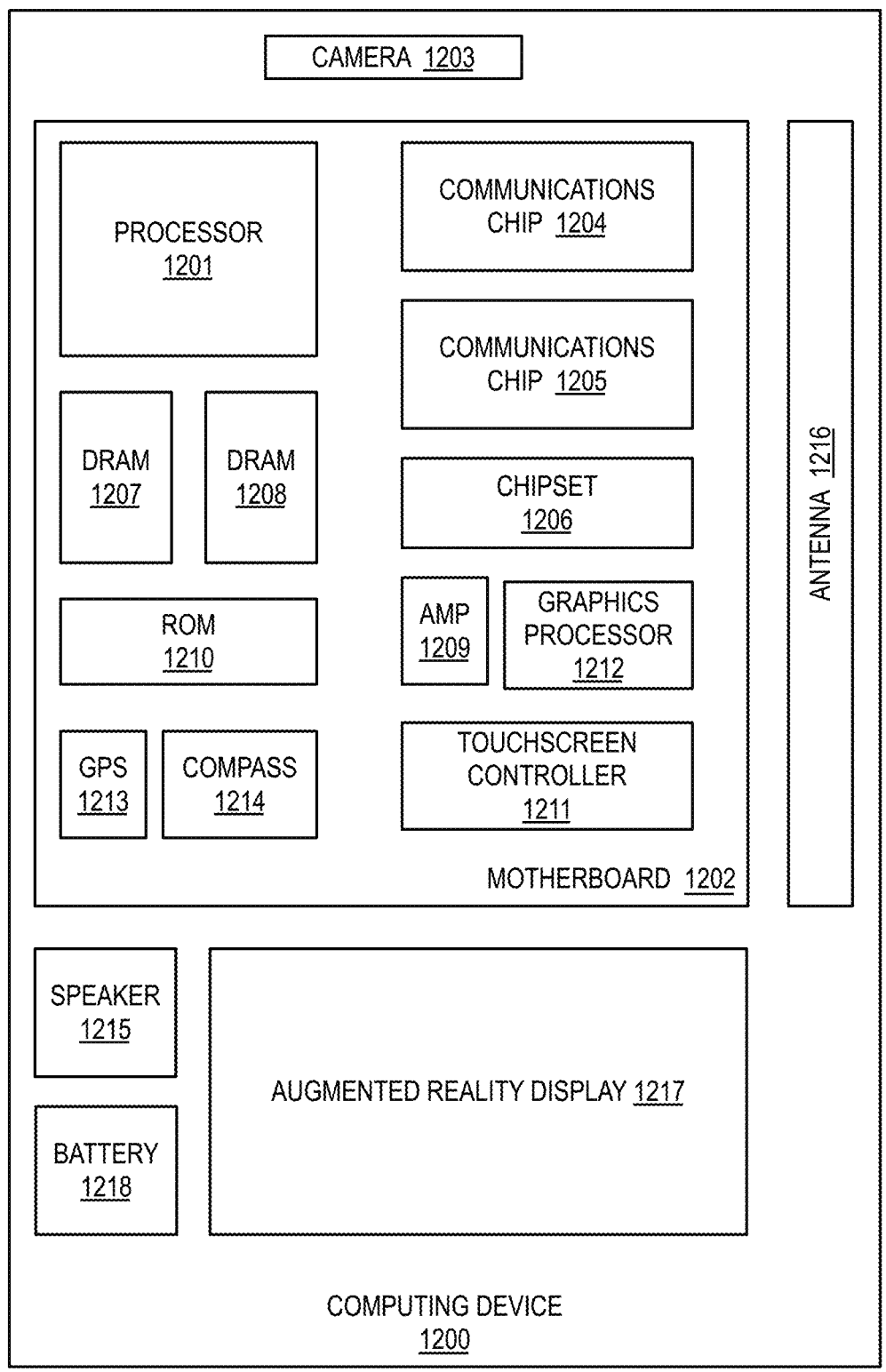
FIG. 12 is a functional block diagram of a computing device, arranged in accordance with at least some embodiments.

FIG. 12 is a functional block diagram of a computing device 1200, arranged in accordance with at least some implementations of the present disclosure. Computing device 1200 or portions thereof may be implemented in AR platform 1100, for example. Computing device 1200 further includes a motherboard 1202 hosting a number of components, such as, but not limited to, a processor 1201 (e.g., an applications processor, a microprocessor, etc.) and one or more communications chips 1204, 1205. Processor 1201 may be physically and/or electrically coupled to motherboard 1202. In some examples, processor 1201 includes an integrated circuit die packaged within the processor 1201. In general, the term "processor" may refer to any device or portion of a device that processes electronic data from registers and/or memory to transform that electronic data into other electronic data that may be stored in registers and/or memory.

In various examples, one or more communication chips 1204, 1205 may also be physically and/or electrically coupled to the motherboard 1202. In further implementations, communication chips 1204 may be part of processor 1201. Depending on its applications, computing device 1200 may include other components that may or may not be physically and electrically coupled to motherboard 1202.

These other components may include, but are not limited to, volatile memory (e.g., DRAM) 1207, 1208, non-volatile memory (e.g., ROM) 1210, a graphics processor 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, and a battery 1218, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 1217 may implement any emissive display device structure(s) discussed herein.

Communication chips 1204, 1205 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1204, 1205 may implement any of a number of wireless standards or protocols, including but not limited to those described elsewhere herein. As discussed, computing device 1200 may include a plurality of communication chips 1204, 1205. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 1204, 1205 may provide a wireless transceiver for computing device 1200. AR display 1217 of computing device 1200 may include or utilize one or more super-lambertian LED source structures discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first examples, an augmented reality display device includes a LED light source comprising inorganic light emitting diodes (LEDs), the LED light source operable to emit visible light over a super-lambertian radiation pattern. The device includes one or more discrete optical elements to couple the light generated by the LED light source to a viewport. The device includes one or more processors to receive image data and control at least one of the LED light source or the optical elements based on the image data.

In one or more second examples, for any of the first examples the super-lambertian radiation pattern has a half-emission-cone-angle of no more than 30°.

In one or more third examples, for any of the first or second examples the discrete optical elements include an optical waveguide associated with a first etendue, and the LED source is associated with a second etendue that is no larger than the first etendue.

In one or more fourth examples, for any of the first through third examples the optical elements include a digital micro-mirror display (DMD) associated with a first etendue, and the LED source is associated with a second etendue that is no larger than the first etendue.

In one or more fifth examples, for any of the first through fourth examples the LEDs further comprises emissive III-N semiconductor structures, the structures including at least one of a III-N semiconductor nanowire or a photonic crystal.

In one or more sixth examples, for any of the fifth examples the LED light source comprises a metamaterial lens over at least a portion of an emissive surface of the LED light source, wherein the metamaterial lens comprises a two-dimensional array of features having at least one dimension that is below the wavelength band emitted by the LED light source.

In one or more seventh examples, for any of the fifth examples the LEDs include a photonic crystal comprising an array of features patterned into a p-type or n-type doped III-N semiconductor layer of the emissive III-N semiconductor structures.

In one or more eighth examples, for any of the fifth examples the emissive III-N semiconductor structures include III-N semiconductor nanowires further comprising a first III-N nanowire LED and a second III-N nanowire LED spaced apart from each other by a distance no more than 1.5 µm.

In one or more ninth examples, for any of the eighth examples the first and second III-N nanowire LEDs each further comprises a III-N semiconductor core of a first conductivity type and having an aspect ratio of at least 10:1, a III-N semiconductor emission layer covering sidewalls of the core, a III-N semiconductor cladding covering sidewalls of the emission layer and having a conductivity type complementary to that of the core, and an optically transmissive electrode layer covering sidewalls of the III-N semiconductor cladding.

In one or more tenth examples, for any of the ninth examples the III-N semiconductor core of both the first and second nanowire LEDs is in contact with a III-N semiconductor template layer having the same conductivity type as the core, and at least one of an optical coating, the photonic crystal, or a metamaterial lens is disposed over the III-N semiconductor template layer.

In one or more eleventh examples, for any of the fifth examples the emissive III-N semiconductor structures include a photonic crystal further comprising a 2D array of features patterned in an impurity-doped III-N semiconductor layer in direct contact with an emission layer comprising a III-N multiple quantum well structure.

In one or more twelfth examples, an inorganic LED light source comprises a plurality of nanowire LEDs, each nanowire LED further comprising a III-N semiconductor core of a first conductivity type and having an aspect ratio of at least 10:1, a III-N semiconductor emission layer covering sidewalls of the core, a III-N semiconductor cladding covering sidewalls of the emission layer and having a conductivity type complementary to that of the core, and an optically transmissive electrode layer covering sidewalls of the III-N semiconductor cladding.

In one or more thirteenth examples, for any of the twelfth examples the plurality of nanowire LEDs include a first III-N nanowire LED and a second III-N nanowire LED, the optically transmissive electrode layer of the first nanowire LED spaced apart from the optically transmissive electrode layer of the second nanowire LED by a distance no more than 1.5 μm.

In one or more fourteenth examples, for any of the thirteenth examples a first end of the III-N semiconductor core of both the first and second nanowire LEDs is in contact with a III-N semiconductor template layer having the same conductivity type as the core, and at least one of an optical coating, a photonic crystal, or a metamaterial lens is disposed over the III-N semiconductor template layer.

In one or more fifteenth examples, the LED light source in any of the fourteenth examples further comprises an optically reflective and electrically conductive material layer at a second end of the III-N semiconductor core, the optically reflective and electrically conductive material layer in direct contact with the optically transmissive electrode layer of both the first and second nanowire LEDs.

In one or more sixteenth examples, the LED light source in any of the fourteenth examples includes a photonic crystal further comprising a 2D array of features patterned in a semiconductor layer, dielectric layer, or conductive oxide layer is disposed over the III-N semiconductor template layer.

In one or more seventeenth examples, the LED light source in any of the sixteenth examples further comprises a metamaterial lens disposed on the photonic crystal.

In one or more eighteenth examples, an inorganic LED light source comprises a plurality of emissive III-N semiconductor structures, each structure including a first III-N material layer impurity doped to a first conductivity type, an emission layer disposed on the first III-N material layer, and a photonic crystal comprising a 2D array of features patterned in a second III-N material layer that is in direct contact with an emission layer comprising a III-N multiple quantum well structure, the second III-N material layer impurity doped to a second conductivity type, complementary to the first conductivity type, wherein the emission layer is operable to emit visible light through the photonic crystal, the visible light emission having a half-emission-cone-angle less than 40°.

In one or more nineteenth examples, the LED light source in any of the eighteenth examples further comprises a metamaterial lens disposed on the photonic crystal.

In one or more twentieth examples, the LED light source in any of the eighteenth examples further comprises a metallic optical mirror layer disposed between the first III-N material layer and a crystalline silicon substrate.

In one or more twenty-first examples, an augmented reality (AR) system comprise a battery, a memory, and a LED light source coupled to the battery and comprising inorganic light emitting diodes (LEDs). The LED light source is operable to emit visible light over a super-lambertian radiation pattern. The system includes one or more discrete optical elements to couple the light generated by the LED light source to a viewport. The system includes one or more processors coupled to the battery and the memory. The processors are to receive image data and control at least one of the LED light source or the optical elements based on the image data.

In one or more twenty-second examples, for any of the twenty-first examples the system includes a wireless communications system coupled to at least one of the memory and the processors, and is to receive the image data from a source remote of the AR system. The super-lambertian radiation pattern has a half-emission-cone-angle of no more than 30°.

In one or more twenty-third examples, for any of the twenty-first through twenty-second examples the discrete optical elements include an optical waveguide associated with a first etendue, and the LED source is associated with a second etendue that is no larger than the first etendue.

In one or more twenty-fourth examples, for any of the twenty-first through twenty-third examples the discrete optical elements include a digital micro-mirror display (DMD) associated with a first etendue, and the LED source is associated with a second etendue that is no larger than the first etendue.

It will be recognized that the embodiments is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An augmented reality display device, comprising:
   an array of inorganic light emitting diodes (LEDs), the array having an emissive surface, the LEDs to emit visible light from the emissive surface with a super-lambertian radiation pattern having a half-emission-cone-angle of no more than 30°, and wherein individual ones of the LEDs have a half-emission-cone-angle exceeding that of the super-lambertian radiation pattern;
   one or more discrete optical elements, exclusive of a discrete collimation lens, to couple the light generated by the array of LEDs to a viewport; and
   one or more processors to receive image data and to control at least one of the array of LEDs or the optical elements based on the image data.

2. The device of claim 1, wherein the discrete optical elements include an optical waveguide associated with a first etendue, and the array of LEDs is associated with a second etendue that is no larger than the first etendue.

3. The device of claim 1, wherein the optical elements include a digital micro-mirror display (DMD) associated with a first etendue, and the array of LEDs is associated with a second etendue that is no larger than the first etendue.

4. The device of claim 1, wherein individual ones of the LEDs further comprise an emissive III-N semiconductor nanowire LED to radially emit visible light along a longitudinal length of the nanowire at an emission angle that is reduced to a solid angle associated with an aspect ratio of the nanowire LED and a pitch of the array of LEDs.

5. The device of claim 4, further comprising an integrated metamaterial lens over at least a portion of the emissive surface of the array, wherein the metamaterial lens comprises a two-dimensional array of features having at least one dimension that is below the wavelength band emitted by one or more of the LEDs.

6. The device of claim 1, wherein individual ones of the LEDs further comprise an emissive III-N semiconductor structure, and wherein the emissive surface comprises a photonic crystal further comprising an array of features patterned into a p-type or n-type doped III-N semiconductor layer of individual ones of the emissive III-N semiconductor structures.

7. The device of claim 4, wherein the pitch of the array is no more than 1.5 µm, a spacing between first and second adjacent nanowire LEDs is no more than 0.5 µm, and the first and second nanowire LEDs have a height that is no less than twice a width of the nanowire LEDs.

8. The device of claim 7, wherein the first and second III-N nanowire LEDs each further comprises:
   a III-N semiconductor core of a first conductivity type and having an aspect ratio of at least 10:1;
   a III-N semiconductor emission layer covering sidewalls of the core;
   a III-N semiconductor cladding covering sidewalls of the emission layer and having a conductivity type complementary to that of the core; and
   an optically transmissive electrode layer covering sidewalls of the III-N semiconductor cladding.

9. The device of claim 8, wherein the III-N semiconductor core of both the first and second nanowire LEDs is in contact with a III-N semiconductor template layer having the same conductivity type as the core, and at least one of an optical coating or a metamaterial lens is over the III-N semiconductor template layer.

10. An augmented reality (AR) system, comprising:
   a battery;
   a memory;
   an array of inorganic light emitting diodes (LEDs) coupled to the battery, the array having an emissive surface, the LEDs to emit visible light from the emissive surface with a super-lambertian radiation pattern having a half-emission-cone-angle of no more than 30°, and wherein individual ones of the LEDs have a half-emission-cone-angle exceeding that of the super-lambertian radiation pattern;
   one or more discrete optical elements, exclusive of a discrete collimation lens, to couple the light generated by the array of LEDs to a viewport; and
   one or more processors coupled to the battery and the memory, the processors to receive image data and to control at least one of the array of LEDs or the optical elements based on the image data.

11. The AR system of claim 10, further comprising:
   a wireless communications system coupled to at least one of the memory and the processor to receive the image data from a source remote of the AR system.

12. The system of claim 10, wherein the discrete optical elements include an optical waveguide associated with a first etendue, and the LED source is associated with a second etendue that is no larger than the first etendue.

13. The system of claim 10, wherein the optical elements include a digital micro-mirror display (DMD) associated with a first etendue, and the LED source is associated with a second etendue that is no larger than the first etendue.

14. The device of claim 10, wherein individual ones of the LEDs further comprise an emissive III-N semiconductor structure, and wherein the emissive surface comprises a photonic crystal further comprising an array of features patterned into a p-type or n-type doped III-N semiconductor layer of individual ones of the emissive III-N semiconductor structures.

15. The system of claim 10, wherein individual ones of the LEDs further comprise an emissive III-N semiconductor nanowire LED to radially emit visible light along a longitudinal length of the nanowire at an emission angle that is reduced to a solid angle associated with an aspect ratio of the nanowire LED and a pitch of the array of LEDs.

16. The system of claim 15, further comprising an integrated metamaterial lens over at least a portion of the emissive surface of the array, wherein the metamaterial lens comprises a two-dimensional array of features having at least one dimension that is below the wavelength band emitted by one or more of the LEDs.

17. The system of claim 14, wherein the pitch of the array no more than 1.5 µm, a spacing between first and second adjacent nanowire LEDs is no more than 0.5 µm, and the first and second nanowire LEDs have a height no less than twice a width of the nanowire LEDs.

18. The system of claim 17, wherein the first and second III-N nanowire LEDs each further comprises:
   a III-N semiconductor core of a first conductivity type and having an aspect ratio of at least 10:1;
   a III-N semiconductor emission layer covering sidewalls of the core;
   a III-N semiconductor cladding covering sidewalls of the emission layer and having a conductivity type complementary to that of the core; and
   an optically transmissive electrode layer covering sidewalls of the III-N semiconductor cladding.

19. The system of claim 18, wherein the III-N semiconductor core of both the first and second nanowire LEDs is in contact with a III-N semiconductor template layer having the same conductivity type as the core, and at least one of an optical coating or a metamaterial lens is over the III-N semiconductor template layer.

* * * * *